(12) United States Patent
Higashi

(10) Patent No.: US 7,025,600 B2
(45) Date of Patent: Apr. 11, 2006

(54) SEMICONDUCTOR DEVICE HAVING EXTERNAL CONTACT TERMINALS AND METHOD FOR USING THE SAME

(75) Inventor: Mitsutoshi Higashi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/781,786

(22) Filed: Feb. 20, 2004

(65) Prior Publication Data

US 2004/0166702 A1   Aug. 26, 2004

(30) Foreign Application Priority Data

Feb. 25, 2003   (JP)   ............................. 2003-047597

(51) Int. Cl.
*H01R 12/00*   (2006.01)

(52) U.S. Cl. ........................................ 439/66; 439/886

(58) Field of Classification Search ................. 439/66, 439/886; 200/269; 324/754; 174/254–256; 29/842–843
See application file for complete search history.

(56) References Cited

U.S. PATENT DOCUMENTS

| | | | | |
|---|---|---|---|---|
| 3,576,415 A | * | 4/1971 | Gwyn, Jr. .................... | 200/269 |
| 4,374,311 A | * | 2/1983 | Okahashi et al. ........... | 200/269 |
| 5,772,451 A | | 6/1998 | Dozier, II et al. | |
| 5,806,181 A | | 9/1998 | Khandros et al. | |
| 6,029,344 A | * | 2/2000 | Khandros et al. ............. | 29/874 |
| 6,168,974 B1 | * | 1/2001 | Chang et al. ................ | 438/109 |
| 6,183,267 B1 | * | 2/2001 | Marcus et al. ................ | 439/66 |
| 6,222,377 B1 | * | 4/2001 | Kato ........................... | 324/754 |
| 6,439,898 B1 | * | 8/2002 | Chua et al. .................... | 439/81 |
| 6,442,831 B1 | * | 9/2002 | Khandros et al. ............. | 29/843 |
| 6,469,386 B1 | * | 10/2002 | Lee et al. ..................... | 257/748 |
| 6,640,432 B1 | * | 11/2003 | Mathieu et al. ............... | 29/842 |
| 6,770,383 B1 | * | 8/2004 | Tanaka et al. ............... | 428/646 |
| 2003/0107131 A1 | | 6/2003 | Higashi et al. | |
| 2003/0173107 A1 | * | 9/2003 | Smith et al. ................. | 174/256 |

FOREIGN PATENT DOCUMENTS

| | | |
|---|---|---|
| JP | 7234262 | 9/1995 |
| JP | 2892505 | 2/1999 |
| JP | 11233220 | 8/1999 |
| JP | 2000-200804 | 7/2000 |
| JP | 2001-9398 | 1/2001 |
| JP | 2002-256478 | 9/2002 |
| JP | 2002-256482 | 9/2002 |

* cited by examiner

*Primary Examiner*—Tho D. Ta
*Assistant Examiner*—Larisa Tsukerman
(74) *Attorney, Agent, or Firm*—Staas & Halsey LLP

(57) ABSTRACT

A method of using a semiconductor device having a plurality of external contact terminals formed of springy wires, usable in a stable state free from variation of contact voltage for a long period even if a contact terminal repeatedly makes contact several hundreds or thousands of times. A tip end of the external contact terminal is plated with individually, selectively removable multiple films, and the plated films are individually, selectively removed by an etching treatment, in accordance with the degree of contamination of the tip end of the external contact terminal, and then the external contact terminal is rinsed and rendered reusable.

3 Claims, 5 Drawing Sheets

SEMICONDUCTOR DEVICE HAVING EXTERNAL CONTACT TERMINALS AND METHOD FOR USING THE SAME

BACKGROUND OF THE INVENTION

1. Field of the Invention

The present invention relates to a semiconductor device having external contact terminals and a method for using the same and, particularty to a semiconductor device having external terminals, such as a semiconductor socket having a number of springy external contact pins or terminals of a micro-spring system, which are used while being brought into contact with pads or solder balls of an interposer or a connector board.

2. Description of the Related Art

In the prior art, in a semiconductor device having a number of springy external contact pins or terminals of a micro-spring type, used as a test probe or otherwise, the external contact pin or terminal is made, for example, of a gold (Au) wire for bonding, which surface is plated with palladium (Pd), indium (in) or others. In such a semiconductor device, while the contact terminals repeat making contact with pads or solder balls on an interposer or a connector board several hundreds or thousands times, a surface of the terminal may be become contaminated or adhered with dirt or solder transferred from the mating object, which increases the electric contact resistance of the external terminal, causing a problem particularly in a high-frequency probe pin in that a test signal is not accurately transmitted even if the adhered solder is slight in amount.

In general, a terminal portion of the semiconductor socket of this kind used as a probe pin is periodically rinsed. However, even though the rinsing is carried out, it is difficult to completely remove the dirt which has been once adhered. Accordingly, there is a problem in that the contact resistance is difficult to maintain at a low level in a stable manner for a long period, which means that the device is not durable against a long term use in a stable state. In addition, as the semiconductor device or the like is generally expensive, it is not economical to frequently replace it with a new one.

There have been various prior arts related thereto as follows. When a laminated film of copper and tin/copper alloy is formed by a single electrolytic plating bath, the plating is carried out in such a manner that an electric potential at which copper is deposited and that at which copper and tin are deposited together are alternately and pulsatively applied to the plating bath (Japanese Unexamined Patent Publication No. 2002-256482); a copper (Cu) layer and an indium (In) layer are alternately formed on a surface of an object to be plated (Japanese Unexamined Patent Publication No. 2002-256478); a wire forming a contact terminal is coated, for example, with a resin so that a tip end of the wiring is exposed from the resin (Japanese Unexamined Patent Publication No. 2000-200804); electrolytic gel is used for removing an unnecessary solder layer or an oxide layer thereof adhered or deposited onto a surface of a contact portion of an IC socket without detaching the IC socket from a printed circuit board (Japanese Unexamined Patent Publication No. 2001-9398); an abrasive layer is provided on a plate-like elastic member of an IC socket to compensate the deterioration of contacts by the opening/closing operation (Japanese Unexamined Patent Publication No. 11-233220); an electrode of an IC socket is dipped in a solder-removal liquid with an acidic agent, rinsed with pure water, and then dried (Japanese Unexamined Patent Publication No. 7-234262); and a pair of terminals are provided so that one of them is brought into contact with the upper surface of a support board generally parallel thereto (Japanese Patent Publication No. 2892505).

As described above, in the prior art external contact pin or terminal of a micro-spring system, the surface thereof is variously treated or plated for the purpose of preventing the electric contact resistance from increasing due to the contamination or the adhesion of foreign matter on the surface. However, a method has not yet been found by which the external pin could be used in a stable state for a long period even if the contact is repeated several hundreds or thousands times.

SUMMARY OF THE INVENTION

The present invention has been made under such the circumstance, and the problem to be solved is to provide a semiconductor device having a number of springy external contact pins or terminals of a micro-spring system, usable for a long period free from the variation of a contact voltage of the respective contact pin or terminal even if it has repeated the contact several hundreds or thousands times, and a method for using the semiconductor device.

To achieve the above problem, according to the present invention, there is provided a semiconductor device comprising: a substrate body; a plurality of external terminals formed of springy wires, the external terminals arranged on and extending from the substrate body; each of the external terminals having a base end connected to the substrate body and a tip end apart from the base end; and each of the external terminals being plated at least the tip end thereof with multiple films which are removable by an etching treatment.

The springy wires are formed of gold, and the multiple films comprises a nickel or nickel alloy plated on a surface of the wire, and a gold film and a palladium film alternately plated thereon.

Alternatively, the springy wires are formed of gold, and the multiple films comprises a nickel or nickel alloy plated on a surface of the wire, and a gold film and a indium film alternately plated thereon.

According to another aspect of the present invention, there is provided a semiconductor device comprising: a substrate body; a plurality of external terminals formed of springy wires, the external terminals arranged on and extending from the substrate body; each of the external terminals having a base end connected to the substrate body and a tip end apart from the base end; an insulating resin layer formed on the substrate body in such a manner that at least a portion including the tip end is exposed from the insulating resin layer; and each of the external terminals being plated at least the exposed portion thereof with multiple films which are removable by an etching treatment.

Preferably, the insulating resin is an elastomeric material, such as silicone rubber.

According to still another aspect of the present invention, there is provided a method of using a semiconductor device, the device a substrate body; a plurality of external terminals formed of springy wires, the external terminals arranged on and extending from the substrate body; each of the external terminals having a base end connected to the substrate body and a tip end apart from the base end; and each of the external terminals being plated at least the tip end thereof with multiple films which are removable by an etching treatment; the method comprising: removing the plated film by an etching treatment in accordance with a degree of contamination of the tip end; and rinsing this semiconductor device to reuse the same.

DETAILED DESCRIPTION OF THE PREFERRED EMBODIMENTS

Embodiments of the present invention will be described in detail, below, with reference to the attached drawings.

FIGS. 1 to 4 illustrate a series of processes for producing the inventive semiconductor device having external contact terminals. First, in FIG. 1, a support board 10 is prepared, in which conductor pads 11 and wirings 12 are provided for forming micro-springs (external contact pins of terminals). This support board 10 may be any of various boards generally used as a board for a semiconductor device, such as a glass-epoxy resin board or a ceramic board.

In general, a number of conductor pads 11 for forming the micro-springs are arranged both on front and back surfaces of the support board in the X direction and the Y direction at a pitch. The wirings 12 are connected to the conductor pads 11, respectively. There are through-hole wirings among the wirings 12, for connecting the conductor pads 11 respectively formed on the front and back surfaces of the support board 10 to each other.

In the vicinity of opposite ends of the support board 10, through-holes 13 are formed for positioning and fixing this support board 10.

Figure 1:
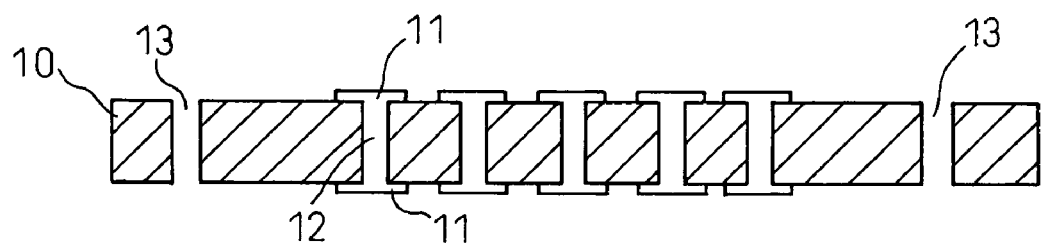
FIG. 1 is a sectional view of a support board used in the present invention.
Figure 2:
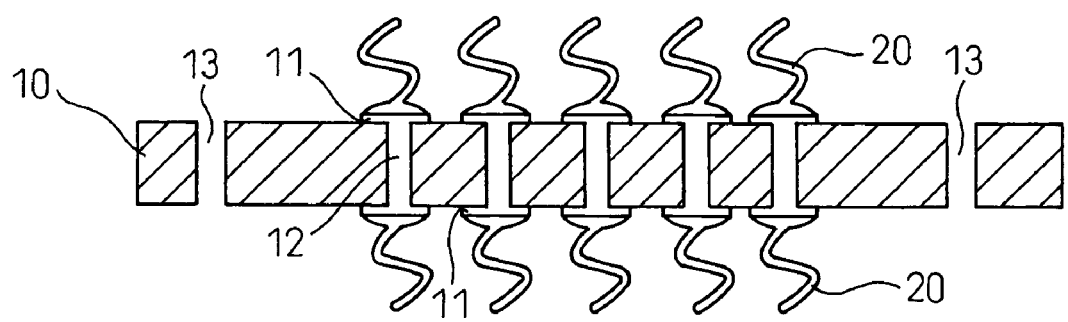
FIG. 2 is a sectional view showing a state in which micro-springs are bonded to the support board.

In FIG. 2, a micro-spring 20 of metal such as gold (Au) is provided as an external contact terminal on the respective conductor pad 11 by a wire-bonding method. As a wire-bonding apparatus (not shown), a conventional one used for connecting an electrode of a semiconductor chip to a lead with a wire in the conventional process for producing a semiconductor device may be adopted.

In one embodiment of the present invention, gold (Au) is used as a material of the micro-spring formed by the wire-bonding method. The micro-spring 20 is bonded to the conductor pad 11 at one end, and extends to form a generally L-shape as seen from a lateral side of the support board 10, which is then cut to form the other end. As seen in the plan view of the support board 10, the micro-spring 20 obliquely extends at a predetermined angle (for example, 30 degrees) relative to the direction (the X direction) of a row of the conductor pads 11. For example, the pitch of the conductor pads 11 and the micro-springs 20 is 0.5 mm in the X direction. Also, the micro-spring 20 has a vertical height from the proximal end to the distal end thereof of 0.56 mm and a horizontal length of 0.65 mm, and is gently curved from the proximal end to the distal end to form an L-shape or an S-shape.

Then, although not shown, at least the tip portions of a number of micro-springs 20 are dipped into a plating bath to be subjected to the plating process. As described later, a nickel film or a nickel alloy film is initially formed, and then a gold film and a palladium film are alternately i.e., successively, laminated thereon by the plating process. Or a gold film and an indium film may be alternately i.e., successively, laminated on the nickel film or the nickel alloy film.

Figure 3:
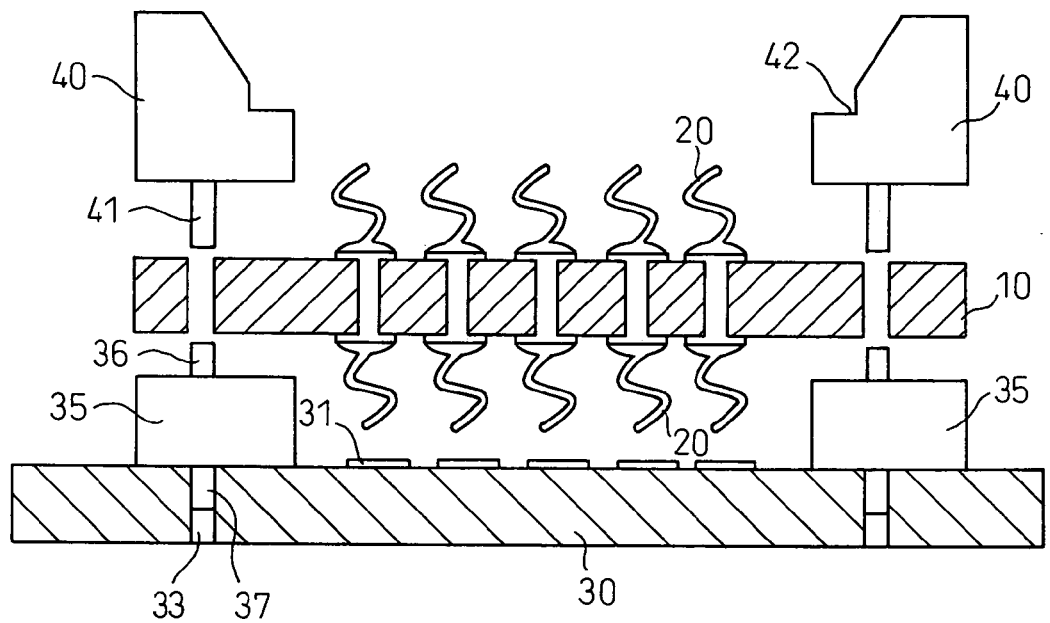
FIG. 3 is a sectional view showing a state in which the support board is attached to a test board.
Figure 4:
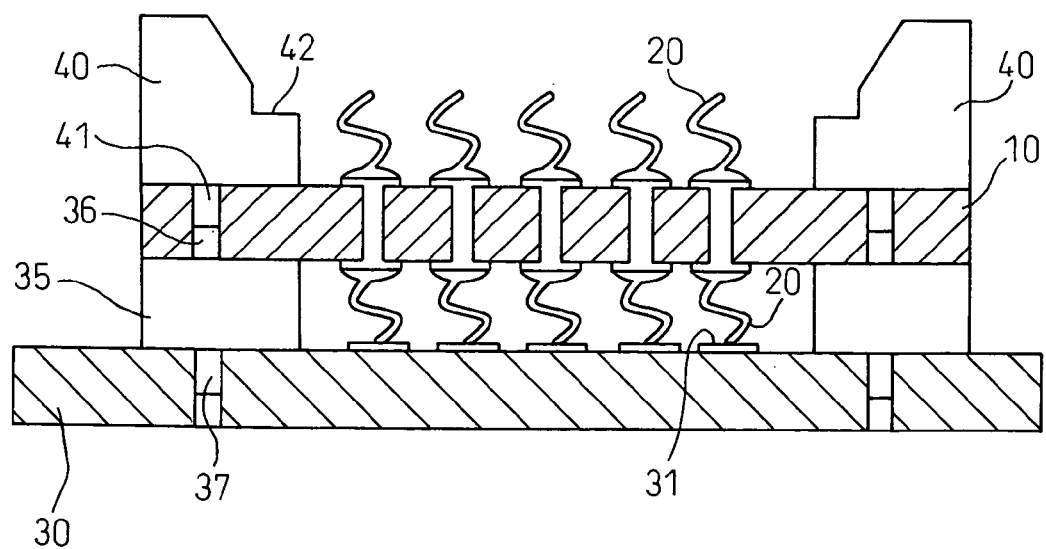
FIG. 4 is a sectional view showing a state in which the attachment of the support board to the test board has been completed.

In FIGS. 3 and 4, a process is illustrated, for bringing the support board 10 into contact with a test board 30. Also on the surface of the test board 30, conductor pads 31 (wirings) are formed in correspondence to the arrangement of micro-springs 20 on the support board 10 to be in contact with the micro-springs 20 of the support board 10 when mounted. Also, the test board 30 has positioning holes 33 at positions in correspondence to the positioning through-holes 13 of the support board 10.

A fastening jig 35 is used for positioning and fixing the support substrate 10 to the test board 30, and includes pins 37 fitting into the holes 33 of the test board 30 and pins 36 fitting into the through-holes 13 of the support board 10. First, the pins 37 of the fastening jig 35 are fitted into the holes 33 of the test board 30 to position the fastening jig 35 to the test board 30. Thereafter, the through-holes 13 of the support board 10 are fitted to the pins 36 of the fastening jig 35 to position and fix the support board 10 to the fastening jig 35 and the test board 30.

A package guide 40 has pins 41 fitting into the positioning through-holes 13 of the support board 10 and a guide portion 42 for mounting a package thereon. The guide portion 42 has shoulders and corners corresponding to edges and four corners of the rectangular package.

As shown in FIG. 4, when the support board 10 is positioned and fixed relative to the test board 30, the tip ends of the respective micro-springs 20 of the support board 10 are brought into contact with the respective conductor pads 31 of the test board 30. At that time, as the micro-springs 20 are formed of springy metallic wire, the micro-springs 20 are brought into contact with the conductor pads 31 while being subjected to the elastic deformation.

Figure 5:
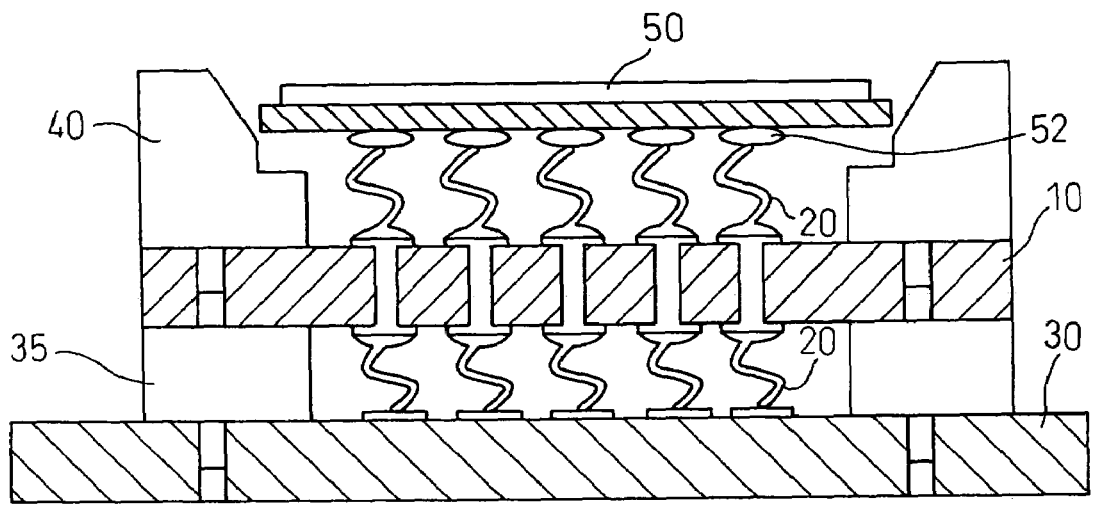
FIG. 5 is a sectional view showing a state in which a package is attached.
Figure 6:
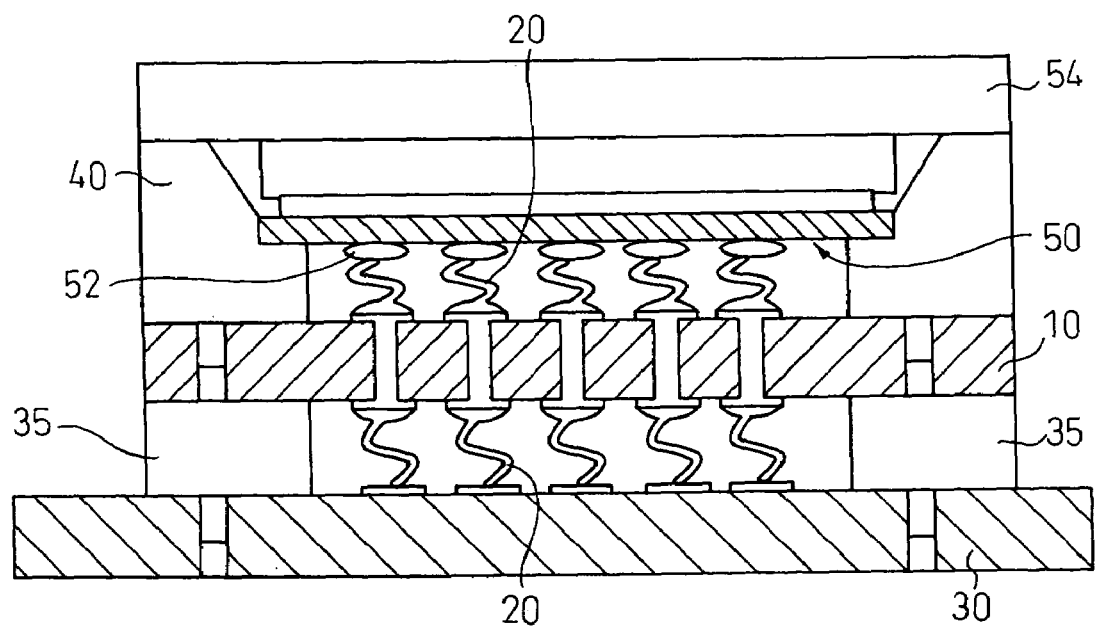
FIG. 6 is a sectional view showing a state in which the attachment of the package has been completed.

FIGS. 5 and 6 illustrate a process for carrying out the test of the package 50 by mounting the package 50 on the package guide 40. The package 50 has external connecting terminals 52 (wirings) arranged in correspondence to the arrangement of micro-springs 20 of the support board 10 and formed to be in contact with the micro-springs 20 of the support board 10 when mounted.

Accordingly, when the package 50 is mounted to the guide portion 42 of the package guide 40 and pushed and fixed by a pressing jig 54, the tip ends of the micro-springs 20 of the support board 10 are brought into contact with the respective external connecting terminals 52 of the package 50. At this time, in the same manner as described before, as the micro-springs 20 are formed of springy metallic wire, the micro-springs 20 are brought into contact with the external connecting terminals 52 while being subjected to the elastic deformation. In one example, the "deformation" of the tip end of the micro-spring 20 when it is in contact with the pad 31 or the terminal 52, that is, a "pressed amount", may be 50 μm or more. Also, the contact resistance may be 0.1Ω or less.

In this regard, while the package is tested in FIG. 6, a semiconductor chip or a semiconductor wafer may be, of course, tested in the same manner instead of the package.

Figure 7:
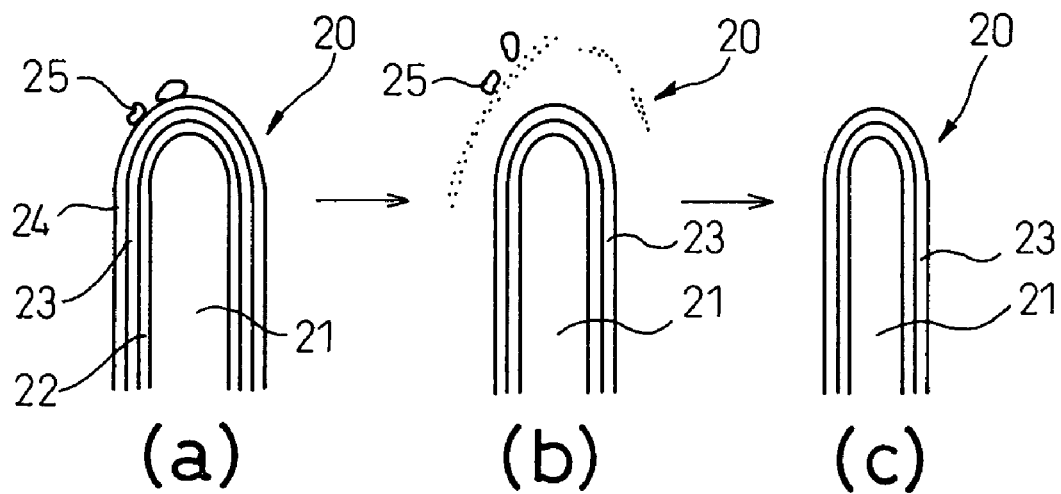
FIG. 7 is a view showing states of a tip end of the micro-spring.

FIG. 7 illustrates a shape of a tip end of the micro-spring 20. The gold wire is vertically provided on the conductor pad 11 of the support board 10 by using a wire-bonding apparatus (not shown), and bent to form a generally L-shape to define the micro-spring 20. In the present invention, however, at least a tip end of the micro-spring 20 is plated to have a multi-layered metallic film.

Initially, a nickel film or a nickel alloy film 22 is formed on the surface of the gold wire material 21. Then, a gold (Au) film 23 and a palladium (Pd) film 24 are alternately laminated thereon by the plating. Although one gold (Au) film 23 and one palladium (Pd) film 24 are solely illustrated in FIG. 7, these films may be repeatedly laminated. Instead of the palladium (Pd) film 24, the gold film and an indium (In) film may be alternately laminated.

When the inventive semiconductor device having the external contact terminals has been used for a long period as a semiconductor socket whereby the attachment and detachment thereof relative to the test board or the package are repeated a number of times, contaminant 25 such as solder may be adhered to the tip end of the micro-spring 20 as shown in FIG. 7(a). According to the present invention, the package pressing jig 54, the package guide 40 and the fastening jig 35 are easily removable to detach the support board 10 from the tester.

Then, the micro-springs 20 of the support board 10 are dipped in an etching liquid to be subjected to the etching treatment. At this time, if the outermost layer of the tip end of the micro-spring 20 is the gold film, an etching liquid capable of dissolving gold (Au) but not reactive with palladium (Pd) or indium (In) is selected. On the contrary, if the outermost layer of the tip end of the micro-spring 20 is the palladium (Pd) film or indium (In) film, another etching liquid capable of dissolving palladium (Pd) or indium (In) but not reactive with gold (Au) may be selected. By such an etching treatment, the dirt due to solder or the like adhered to the surface of the tip end of the micro-spring 20 is removed together with the outermost layer thereof as shown in FIG. 7(b). Thereafter, the micro-spring 20 is rinsed so that the surface thereof is free from the dirt to be usable again as a semiconductor socket as shown in FIG. 7(c).

As described above, according to the present invention, a plurality of kinds plated films are alternately laminated on the micro-spring 20, which are soluble in etching liquids, respectively, different from each other. Thereby, it is possible to solely dissolve the plated film of the outermost layer and not to damage the micro-spring 20 due to the excessive etching. Thus, the dirt of the micro-spring 20 is removable a plurality of times (corresponding to the number of the plated films) by the etching treatment. If the multi-layered metallic film has been completely removed by the repeated etching treatment, the micro-spring 20 is again alternately laminated with a plurality of kinds plated films which are soluble in etching liquids, respectively, different from each other, and may be reusable.

When it is desired to always provide a special plated film on the outermost layer of the micro-spring in view of the contact resistance (for example, in a multi-layered metallic film in which a gold film and a palladium film are alternately laminated, when it is desired to always provide the gold film on the outermost layer), the outermost gold film is removed by the etching treatment, then the next palladium film is subjected to the etching treatment to expose the gold film on the surface.

Figure 8:
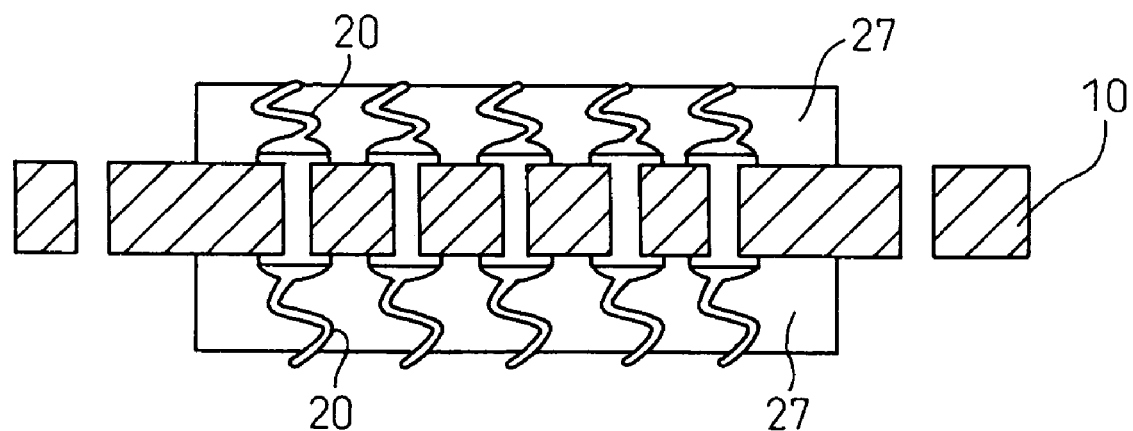
FIG. 8 is a view of another embodiment of the present invention corresponding to FIG. 2.
Figure 9:
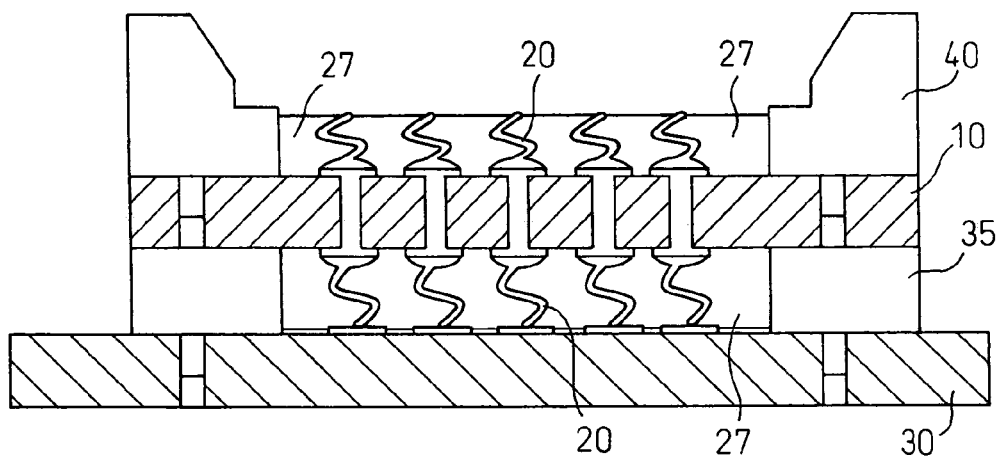
FIG. 9 is a view of the other embodiment of the present invention corresponding to FIG. 4.
Figure 10:
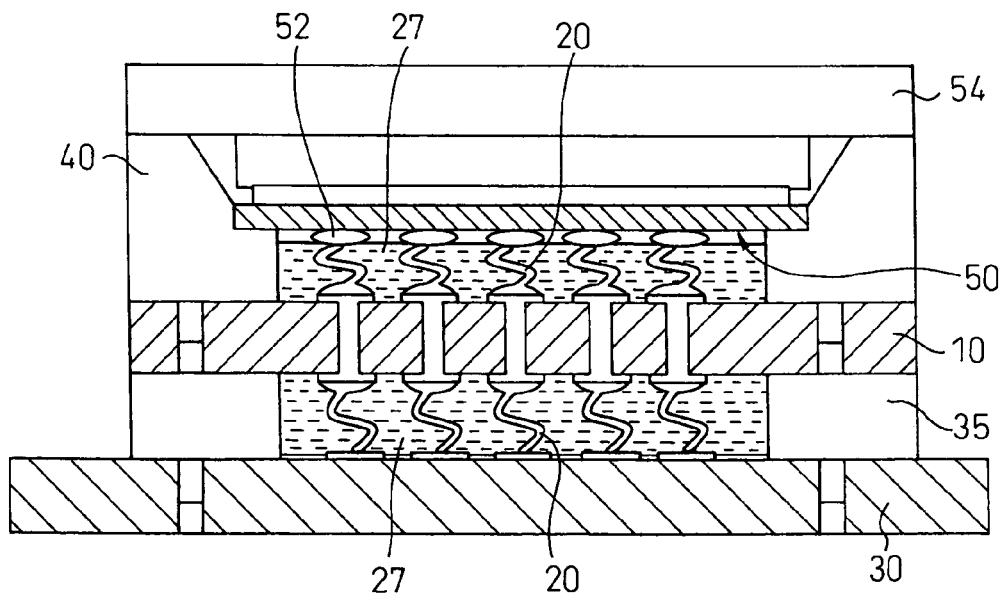
FIG. 10 is a view of the other embodiment of the present invention corresponding to FIG. 6.

FIGS. 8 to 10 illustrate a modification of the preceding embodiment of the present invention, in which FIGS. 8, 9 and 10 correspond, respectively, to the processes shown in FIGS. 2, 4 and 6. In this modification, the micro-springs 20 are embedded in an elastomeric layer 27 of a suitable resin such as a silicone resin having a rubber-like elasticity so that the tip ends of the micro-springs 20 are exposed outside. Such an elastomeric layer 27 may be molded, for example, by the potting of resin.

Also in this embodiment, the micro-spring 20 itself may be formed by using the wire-bonding method of gold wire In the same manner as in the preceding embodiment. On the tip end of the micro-spring 20 exposed out of the elastomeric layer 27, the surface of the gold wire material 21 is covered with the nickel or nickel alloy film 22 formed by the plating, on which the gold film 23 and the palladium film (or indium film) 24 are alternately laminated by the plating as described before. In this regard, a portion to be plated may be a whole micro-spring 20 or solely the tip end thereof exposed out of the elastomeric layer 27.

When the dirt 25 due to solder or the like has been adhered to the tip end of the micro-spring 20 after the long term use, the support board 10 is removed from the tester in the same manner as described before, and the micro-springs 20 are dipped in the etching liquid and subjected to the etching treatment to remove the outermost plated film, after which they are rinsed to remove the solder dirt or others adhered to the surface. Thus, the micro-springs 20 are reusable.

In the embodiment shown in FIGS. 8 to 10, the deformation of the micro-spring 20 due to external force can be prevented by virtue of the elastomeric layer 27. Accordingly, even though the micro-springs 20 are brought into contact with the jigs or others during the etching treatment or the rinsing thereof, it is possible to prevent the micro-springs 20 from being deformed.

It should be understood by those skilled in the art that the foregoing description relates to only some of preferred embodiments of the disclosed invention, and that various changed and modifications may be made to the invention without departing from the spirit and scope thereof.

As described hereinbefore, according to the present invention, even if the electric contact resistance increases due to the adhesion of dirt or foreign matter on the surface of the external contact pins or terminals of a micro-spring system after the repetition of contact several hundreds or thousands times, it is possible to reuse the inventive semiconductor device as a semiconductor socket by an extremely easy method because the tip end of the contact terminal has a multi-layered plated film and the outermost film is removed by the etching treatment and the rinsing. Thus, the inventive semiconductor device could be used as a semiconductor socket or others in a stable state for a long period.

What is claimed is:

1. A method of using a semiconductor device, said device comprising a substrate body; a plurality of external contact terminals formed of springy wires, said external contact terminals arranged on and extending from said substrate body; each of said external contact terminals having a base end connected to said substrate body and a tip end apart from said base end; and each of said external contact terminals being plated on at least said tip end thereof with a film of multiple successively plated layers which are selectively removable by an etching treatment, said method comprising:

selectively removing one or more of said layers of said plated film by an etching treatment in accordance with a degree of contamination of the tip end, wherein:

an outermost layer of the successively plated layers is dissolvable by a first etching agent but is not reactive to a second etching agent, and a next most outermost layer is dissolvable by the second etching agent but is not reactive to the first etching agent, and said selectively removing comprises using the first etching agent to remove the outmost layer; and rinsing the semiconductor device to enable reuse of same.

2. A method of using a semiconductor device comprising a substrate body, a plurality of external contact terminals formed of springy wires arranged on and extending from said substrate body, each of said external contact terminals having a base end connected to said substrate body and a tip end apart from said base end, and each of said external contact terminals being plated, at least on said tip end thereof, with a multiple-layered film which is selectively removable by an etching treatment, said method comprising:

selectively removing one or more layers of said multiple-layered, plated film by an etching treatment in accordance with a degree of contamination of the tip end wherein, when the first outermost layer has been selectively removed by a first etching agent, removing the next most outermost layer by using a second etching agent; and rinsing the semiconductor device subsequently to the etching treatment to enable reuse of same.

3. A method of using a semiconductor device, said device comprising, a substrate body; a plurality of external contact terminals formed of springy wires, said external contact terminals arranged on and extending from said substrate body; each of said external contact terminals having base end connected to said substrate body and a tip end apart from said base end; and each of said external contact terminals being plated on at least said tip end thereof with a film of multiple successively plated layers which are selectively removable by an etching treatment, said method comprising:

selectively removing one or more of said layers of said plated film by an etching treatment in accordance with a degree of contamination of the tip end, and following selective removal of all of the successively plated layers, replating each of the plurality of external contact terminals with a film of selectively plated and selectively removable, multiple layers, by respective, first and second etching agents, for reuse of the semiconductor device and associated plurality of external contact terminals.

* * * * *

UNITED STATES PATENT AND TRADEMARK OFFICE
CERTIFICATE OF CORRECTION

PATENT NO. : 7,025,600 B2  
APPLICATION NO. : 10/781786  
DATED : April 11, 2006  
INVENTOR(S) : Mitsutoshi Higashi Page 1 of 1

It is certified that error appears in the above-identified patent and that said Letters Patent is hereby corrected as shown below:

On the cover page, item (56), References Cited, Non-Patent Documents, insert --Kirt R. Williams, "Journal of Microelectromechanical Systems, Vol. 12, No. 6, December 2003, pages 771-778--

Column 1, line 8, change "particularty" to --particular--

Column 1, line 20, change "(in)" to --(In)--

Column 1, line 24, after "may" delete "be"

Column 2, line 41, change "a indium" to --an indium--

Column 6, line 11, change "In" to --in--

Column 8, line 2, after "comprising" delete ","

Column 8, line 5, after "having", insert --a--

Signed and Sealed this

Second Day of January, 2007

JON W. DUDAS  
*Director of the United States Patent and Trademark Office*